(12) United States Patent
Chuang et al.

(10) Patent No.: US 11,362,098 B2
(45) Date of Patent: Jun. 14, 2022

(54) METHOD FOR MANUFACTURING MEMORY DEVICE

(71) Applicant: Winbond Electronics Corp., Taichung (TW)

(72) Inventors: Che-Fu Chuang, Changhua County (TW); Jian-Ting Chen, Tainan (TW); Yu-Kai Liao, Yunlin County (TW); Hsiu-Han Liao, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 57 days.

(21) Appl. No.: 17/061,442

(22) Filed: Oct. 1, 2020

(65) Prior Publication Data

US 2021/0151447 A1  May 20, 2021

(30) Foreign Application Priority Data

Nov. 20, 2019 (TW) ................................. 108142119

(51) Int. Cl.
*H01L 27/11517* (2017.01)
*H01L 29/66* (2006.01)

(52) U.S. Cl.
CPC .... *H01L 27/11517* (2013.01); *H01L 29/6653* (2013.01); *H01L 29/66825* (2013.01); *H01L 29/66969* (2013.01)

(58) Field of Classification Search
None
See application file for complete search history.

(56) References Cited

U.S. PATENT DOCUMENTS

| 6,380,042 | B1* | 4/2002 | Huang | H01L 27/115 257/E21.507 |
| 9,728,543 | B1* | 8/2017 | Pan | H01L 29/66825 |
| 2002/0177284 | A1* | 11/2002 | Huang | H01L 29/6656 438/303 |
| 2002/0192868 | A1* | 12/2002 | Kim | H01L 29/6656 257/E21.507 |
| 2003/0214000 | A1* | 11/2003 | Jang | H01L 27/105 257/E21.654 |
| 2004/0038490 | A1* | 2/2004 | Kojima | H01L 21/823814 438/303 |
| 2005/0145942 | A1* | 7/2005 | Gehres | H01L 29/6659 257/350 |

(Continued)

*Primary Examiner* — Vincent Wall
(74) *Attorney, Agent, or Firm* — Muncy, Geissler, Olds & Lowe, P.C.

(57) ABSTRACT

A method for manufacturing a memory device is provided. The method includes the following steps: providing a substrate; forming a plurality of first gate structures; forming a lining layer on the substrate; forming a spacer layer on the lining layer; forming a stop layer on the spacer layer; forming a first sacrificial layer on the stop layer; removing a portion of the first sacrificial layer to expose the stop layer on the first gate structures, and to expose the stop layer at the bottoms of the trenches; removing the stop layer at the bottoms of the trenches to expose the spacer layer; removing the remaining first sacrificial layer; forming a second sacrificial layer on the substrate; and removing the second sacrificial layer, and removing the spacer layer and the lining layer at the bottoms of the plurality of trenches to expose the substrate.

20 Claims, 13 Drawing Sheets

(56) References Cited

U.S. PATENT DOCUMENTS

| | | | |
|---|---|---|---|
| 2005/0156229 A1* | 7/2005 | Yeap | H01L 27/11526 257/E21.687 |
| 2006/0189051 A1* | 8/2006 | Kim | H01L 21/76897 257/E21.507 |
| 2008/0128785 A1* | 6/2008 | Park | H01L 27/105 257/E29.302 |
| 2009/0186475 A1* | 7/2009 | Ting | H01L 21/823864 257/E21.294 |
| 2009/0224287 A1* | 9/2009 | Shin | H01L 29/165 257/192 |
| 2010/0308420 A1* | 12/2010 | Usujima | H01L 27/11526 257/E21.409 |
| 2011/0006355 A1* | 1/2011 | Shen | H01L 29/788 257/316 |
| 2011/0198675 A1* | 8/2011 | Ng | H01L 29/6653 257/288 |
| 2011/0201170 A1* | 8/2011 | Chiang | H01L 21/76897 438/303 |
| 2013/0078775 A1* | 3/2013 | Liao | H01L 27/11573 257/E21.409 |
| 2016/0035843 A1* | 2/2016 | Vinet | H01L 29/6656 438/154 |
| 2017/0125586 A1* | 5/2017 | Lee | H01L 29/785 |
| 2018/0323107 A1* | 11/2018 | Zhou | H01L 21/266 |
| 2019/0013322 A1* | 1/2019 | Tsai | H01L 21/76831 |
| 2019/0305110 A1* | 10/2019 | Chen | H01L 21/76897 |
| 2020/0273871 A1* | 8/2020 | Chen | H01L 27/11556 |
| 2020/0343256 A1* | 10/2020 | Tsai | H01L 27/11521 |
| 2021/0398813 A1* | 12/2021 | Shen | H01L 29/6656 |

* cited by examiner

METHOD FOR MANUFACTURING MEMORY DEVICE

CROSS REFERENCE TO RELATED APPLICATIONS

This application claims priority of Taiwan Patent Application No. 108142119, filed on Nov. 20, 2019, the entirety of which is incorporated by reference herein.

BACKGROUND

Technical Field

The present disclosure relates to a method for manufacturing a semiconductor device, and in particular it relates to a method for manufacturing a memory device.

Description of the Related Art

With the rapid growth of the market, increasing the integrity and reducing the critical size of memory devices has become a trend. With this trend, memory devices often encounter problems such as word-line leakage, short-circuiting bit lines, and poor high-temperature data retention (HTDR). In addition, the residue of metal particles or metal oxide on the dielectric layer between the bit lines can also easily cause short-circuit of the bit lines. Therefore, a process that can further improve the performance of the memory device is still one of the goals that the industry is currently aiming at.

SUMMARY

In accordance with some embodiments of the present disclosure, a method for manufacturing a memory device is provided. The method for manufacturing a memory device includes the following steps: providing a substrate, the substrate comprising a memory cell region and a peripheral region; forming a plurality of first gate structures on the memory cell region; forming at least one second gate structure on the peripheral region; forming a lining layer on the substrate, wherein the lining layer covers the plurality of first gate structures and the at least one second gate structure, and the lining layer is formed at bottoms of a plurality of trenches between the plurality of first gate structures; forming a spacer layer on the lining layer; forming a stop layer on the spacer layer; forming a first sacrificial layer on the stop layer, wherein the first sacrificial layer covers the plurality of first gate structures and the at least one second gate structure, and the first sacrificial layer is formed at the bottoms of the plurality of trenches; removing a portion of the first sacrificial layer to expose the stop layer on the plurality of first gate structures and the at least one second gate structure, and to expose the stop layer at the bottoms of the plurality of trenches; removing the stop layer at the bottoms of the plurality of trenches to expose the spacer layer; removing the remaining first sacrificial layer; forming a second sacrificial layer on the substrate, wherein the second sacrificial layer covers the plurality of first gate structures, the lining layer, the spacer layer, and the stop layer, and the second sacrificial layer fills in the plurality of trenches; and removing the second sacrificial layer, and removing the spacer layer and the lining layer at the bottoms of the plurality of trenches to expose the substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
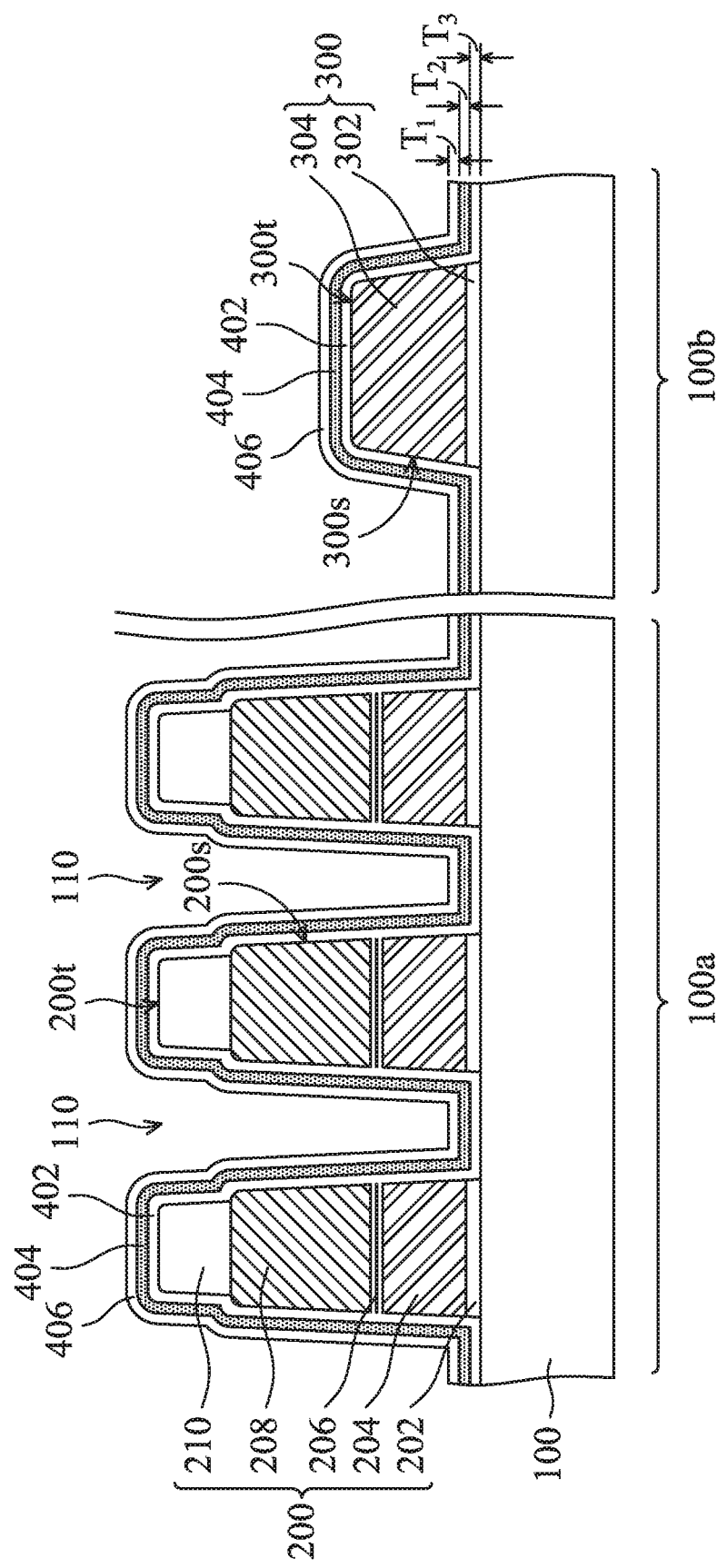
FIGS. 1A to 1L are cross-sectional diagrams of a memory device during the stages of manufacture in accordance with some embodiments of the present disclosure.

Referring to FIG. 1A, a substrate 100 may be provided first. The substrate 100 may include a memory cell region 100a and a peripheral region 100b.

Next, a plurality of first gate structures 200 may be formed on the memory cell region 100a of the substrate 100, and at least one second gate structure 300 may be formed on the peripheral region 100b. In some embodiments, the first gate structures 200 may define a plurality of trenches 110 located therebetween.

As shown in FIG. 1A, in some embodiments, the first gate structure 200 and the second gate structure 300 may be a stacked structure having several layers. Specifically, in accordance with some embodiments, the first gate structure 200 may include a tunneling dielectric layer 202, a conductive layer 204, an inter-gate dielectric layer 206, and a conductive layer 208 that are sequentially stacked on the substrate 100.

In some embodiments, the conductive layer 204 may function as a floating gate. In some embodiments, the conductive layer 208 may function as a control gate.

In some embodiments, the material of the tunneling dielectric layer 202 may include silicon oxide. In some embodiments, the material of the conductive layer 204 may include doped polycrystalline silicon, undoped polycrystalline silicon, or a combination thereof. In some embodiments, the material of the inter-gate dielectric layer 206 may include a composite layer composed of oxide layer/nitride layer/oxide layer (ONO), such as a composite layer composed of silicon oxide/silicon nitride/silicon oxide. The material of the conductive layer 208 may include doped polycrystalline silicon, undoped polycrystalline silicon, or a combination thereof.

In addition, in some embodiments, the first gate structure 200 may further include a gate masking layer 210, and the gate masking layer 210 may be disposed on the conductive layer 208. In some embodiments, the material of the gate masking layer 210 may include silicon oxide, silicon nitride, silicon oxynitride, or a combination thereof.

On the other hand, in accordance with some embodiments, the second gate structure 300 may include a gate dielectric layer 302 and a conductive layer 304 that are sequentially stacked on the substrate 100. In some embodiments, the conductive layer 304 may serve as a gate for a logic element. In some embodiments, the material of the conductive layer 304 may include doped polycrystalline silicon.

Next, as shown in FIG. 1A, a lining layer 402 may be formed on the substrate 100. The lining layer 402 may cover the first gate structure 200 and the second gate structure 300, and the lining layer 402 may be formed at bottoms of the trenches 110 between the first gate structures 200. Specifically, in some embodiments, the lining layer 402 may be conformally formed on the substrate 100, the first gate structure 200, and the second gate structure 300. Furthermore, the lining layer 402 may cover the sidewalls 200s and the top surface 200t of the first gate structure 200, and be in contact with the sidewalls 200s and the top surface 200t. The lining layer 402 may cover the sidewalls 300s and the top surface 300t of the second gate structure 300, and be in contact with the sidewalls 300s and the top surface 300t.

In some embodiments, at least one ion implantation process may be performed after the steps of forming the first gate structure 200 and the second gate structure 300 and before the step of forming the lining layer 402 to form a plurality of lightly doped regions (not illustrated) in the memory cell region 100a of the substrate 100, and to form a plurality of lightly doped regions (not illustrated) in the peripheral region 100b of the substrate 100.

In some embodiments, the material of the lining layer 402 may include silicon oxide. In addition, in some embodiments, the material of the lining layer 402 may be, for example, a high-temperature oxide (HTO).

Next, a spacer layer 404 may be formed on the lining layer 402. The spacer layer 404 may cover the lining layer 402, the first gate structure 200 and the second gate structure 300. In addition, the spacer layer 404 may also be formed at the bottoms of the trenches 110 that are between the first gate structures 200. Specifically, in some embodiments, the spacer layer 404 may be conformally formed on the lining layer 402 and in contact with the lining layer 402. Furthermore, the spacer layer 404 may cover the sidewalls 200s and the top surface 200t of the first gate structure 200 and the sidewalls 300s and the top surface 300t of the second gate structure 300.

In some embodiments, the material of the spacer layer 404 may include silicon nitride, silicon oxynitride, or a combination thereof.

Next, a stop layer 406 may be formed on the spacer layer 404. The stop layer 406 may cover the spacer layer 404, the lining layer 402, the first gate structure 200 and the second gate structure 300. In addition, the stop layer 406 may also be formed at the bottoms of the trenches 110 that are between the first gate structures 200. Specifically, in some embodiments, the stop layer 406 may be conformally formed on the spacer layer 404 and in contact with the spacer layer 404. Furthermore, the stop layer 406 may cover the sidewalls 200s and the top surface 200t of the first gate structure 200 and the sidewalls 300s and the top surface 300t of the second gate structure 300.

In some embodiments, the material of the stop layer 406 may include silicon oxide.

In addition, the stop layer 406 may have a thickness $T_1$, the spacer layer 404 may have a thickness $T_2$, and the lining layer 402 may have a thickness $T_3$. According to some embodiments, the thickness $T_1$ of the stop layer 406 may be greater than the thickness $T_2$ of the spacer layer 404, and the thickness $T_1$ of the stop layer 406 may be greater than the thickness $T_3$ of the lining layer 402. Furthermore, in accordance with some embodiments, the thickness $T_1$ of the stop layer 406 may be about 0.8 to about 1.5 times the sum of the thicknesses of the lining layer 402 and the spacer layer 404 (i.e. the thickness $T_2$ plus the thickness $T_3$).

Figure 1B:
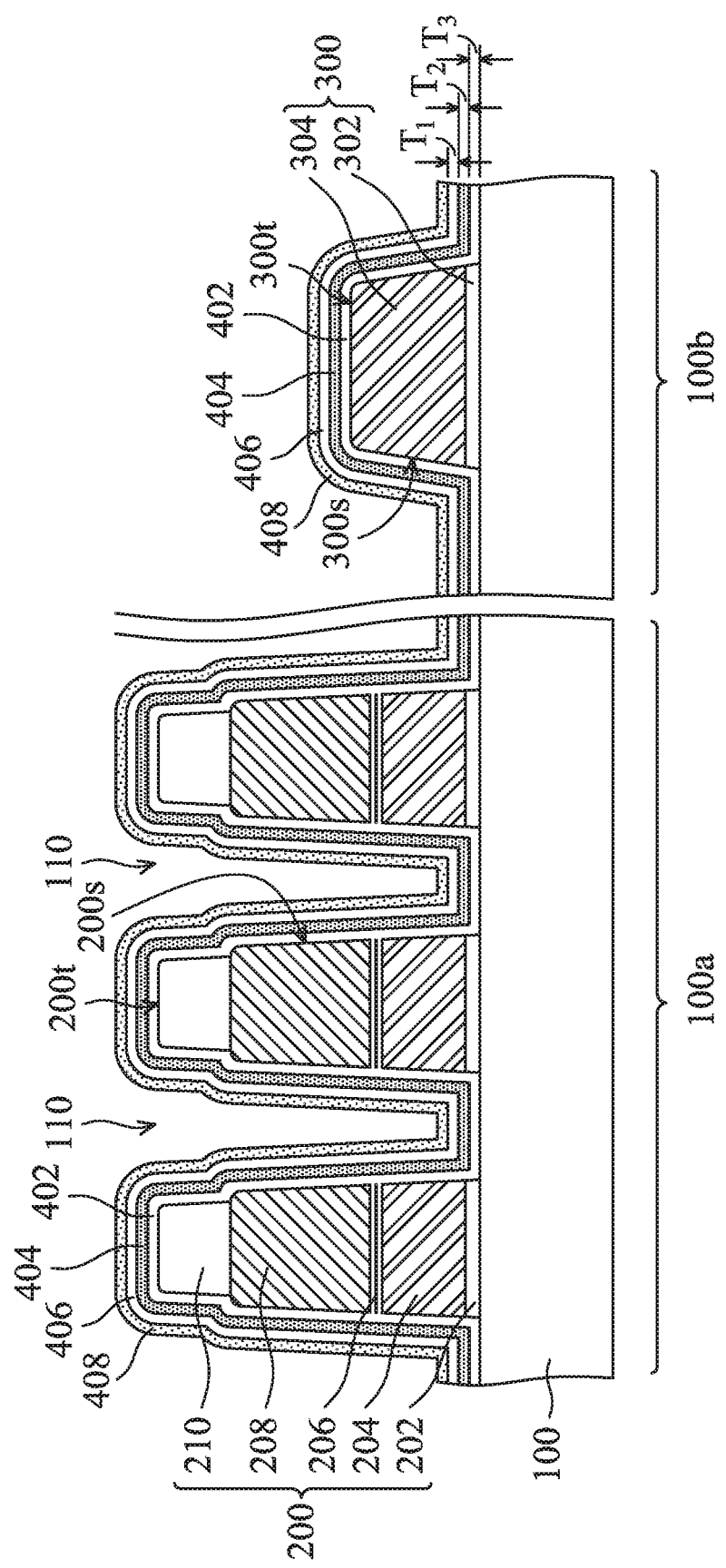

Next, referring to FIG. 1B, a first sacrificial layer 408 may be formed on the stop layer 406. The first sacrificial layer 408 can cover the first gate structure 200 and the second gate structure 300, and the first sacrificial layer 408 may be formed at the bottoms of the trenches 110. Furthermore, the first sacrificial layer 408 may cover the stop layer 406, the spacer layer 404, and the lining layer 402. Specifically, in some embodiments, the first sacrificial layer 408 may be conformally formed on the stop layer 406. In addition, the first sacrificial layer 408 may cover the sidewalls 200s and the top surface 200t of the first gate structure 200 and the sidewalls 300s and the top surface 300t of the second gate structure 300.

In some embodiments, the material of the first sacrificial layer 408 may include polycrystalline silicon.

Figure 1C:
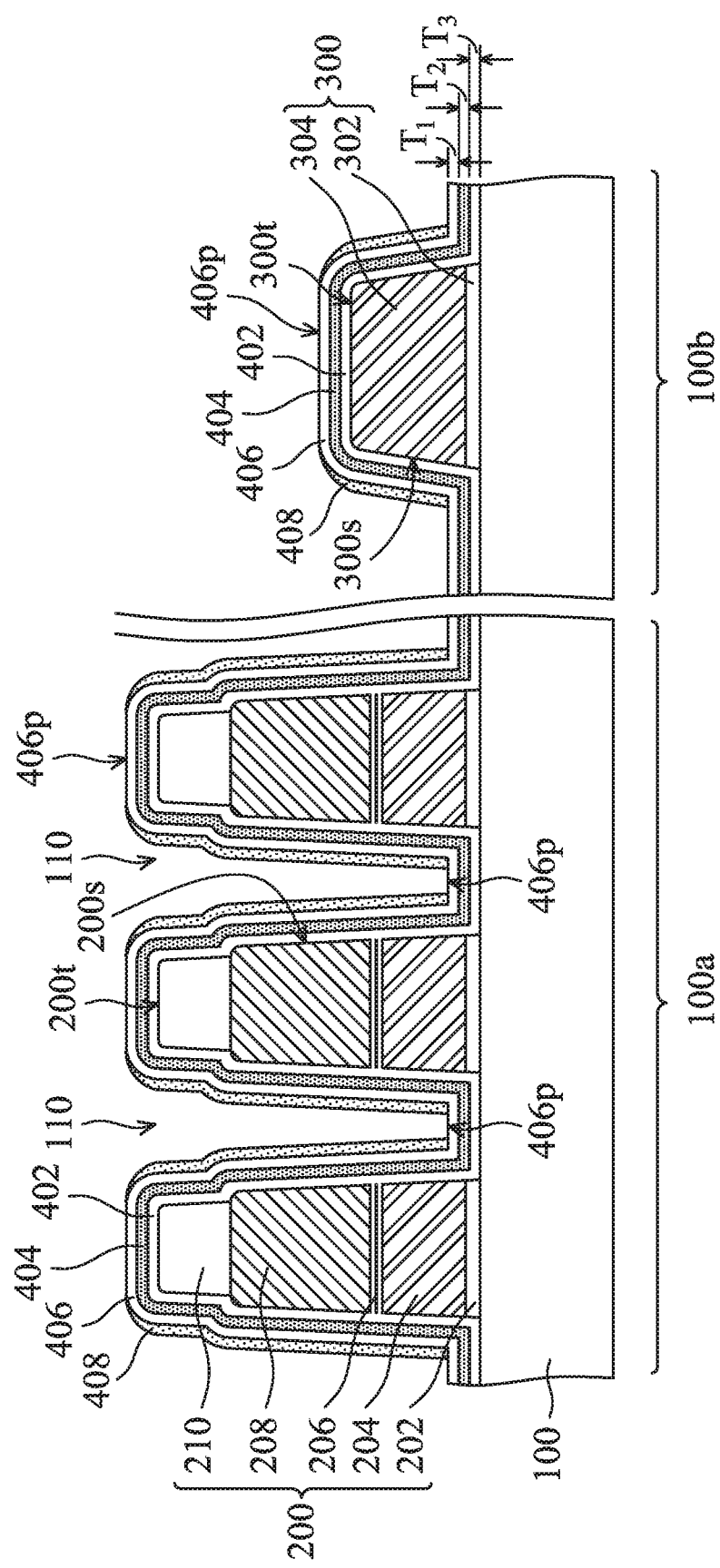

Next, referring to FIG. 1C, a portion of the first sacrificial layer 408 may be removed to expose the stop layer 406 on the first gate structure 200 and the second gate structure 300, and the stop layer 406 at the bottoms of the trenches 110. As shown in FIG. 1C, in some embodiments, after a portion of the first sacrificial layer 408 is removed, a portion of the top surface 406p of the stop layer 406 located above the first gate structure 200 and the second gate structure 300 may be exposed. Moreover, a portion of the top surface 406p of the stop layer 406 located at the bottoms of the trenches 110 may be exposed.

In other words, in this step, the first sacrificial layer 408 that covers the top surface 200t of the first gate structure 200 and the top surface 300t of the second gate structure 300 is substantially removed. On the other hand, the first sacrificial layer 408 that covers the sidewalls 200s of the first gate structure 200 and the sidewalls 300s of the second gate structure 300 is substantially not removed. The first sacrificial layer 408 may still exist on both sides of the first gate structure 200 and the second gate structure 300.

Next, referring to FIG. 1D, the stop layer 406 located at the bottoms of the trenches 110 may be removed to expose the spacer layer 404 that is below the stop layer 406. Specifically, in some embodiments, after the portion of the stop layer 406 that has been exposed (as shown in FIG. 1C) is removed, a portion of the top surface 404p of the spacer layer 404 located above the first gate structure 200 and the second gate structure 300 may be exposed. In some embodiments, a gap GP1 may exist between the top surface 404p of the stop layer 406 located above the first gate structure 200 and the first sacrificial layer 408. In some embodiments, the gap GP1 may also exist between the top surface 404p of the stop layer 406 located above the second gate structure 300 and the first sacrificial layer 408. In addition, a portion of the top surface 404p of the spacer layer 404 at the bottoms of the trenches 110 may be exposed. In some embodiments, a gap GP2 may exist between the top surface 404p of the spacer layer 404 at the bottoms of the trenches 110 and the bottom surface of the first sacrificial layer 408.

It should be noted that the above step of removing the stop layer 406 at the bottoms of the trenches 110 selectively removes the stop layer 406 without removing the spacer layer 404. In some embodiments, the step of removing a portion of the first sacrificial layer 408 may be performed using a wet etching process.

Figure 1D:
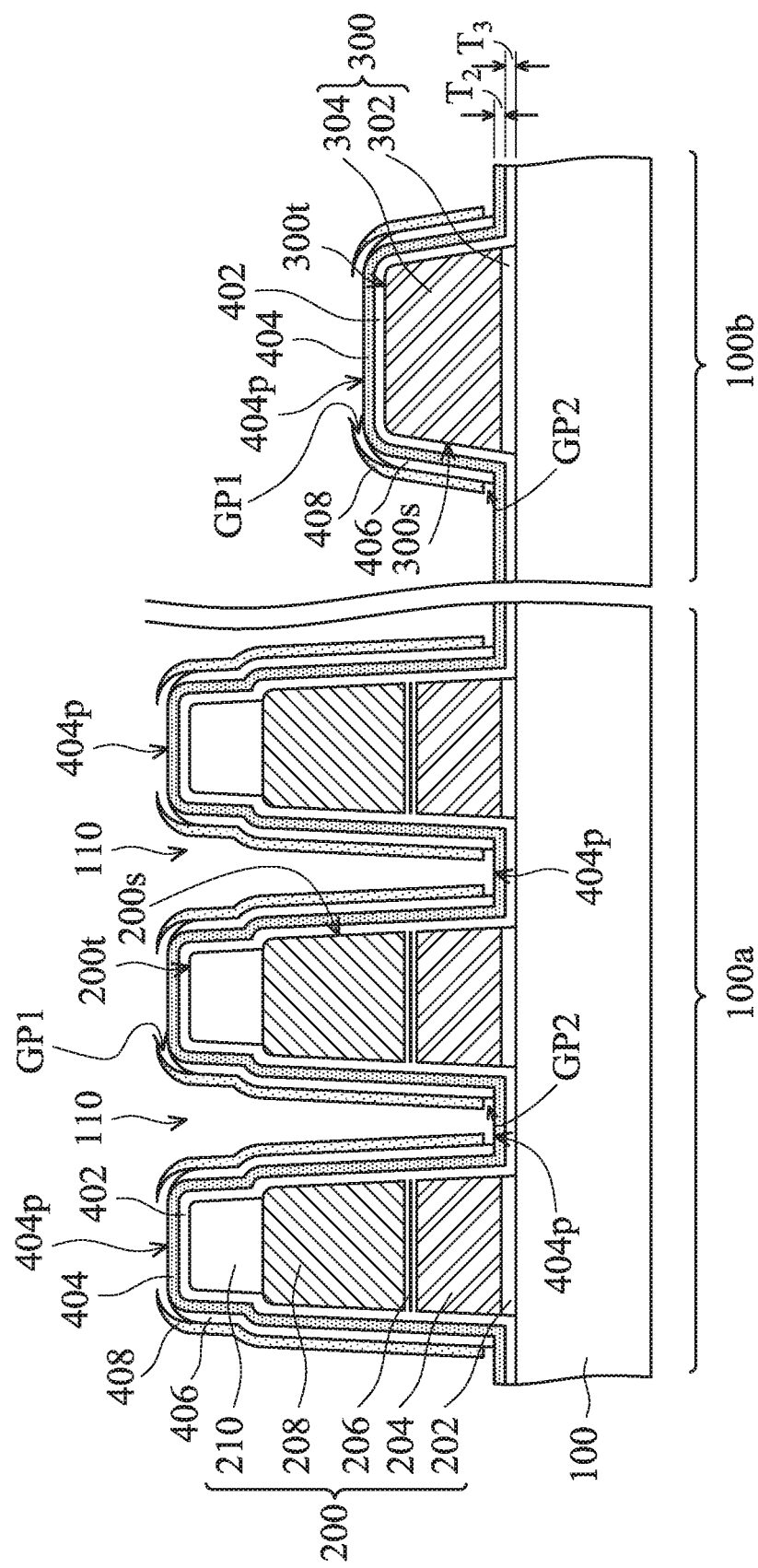
Figure 1E:
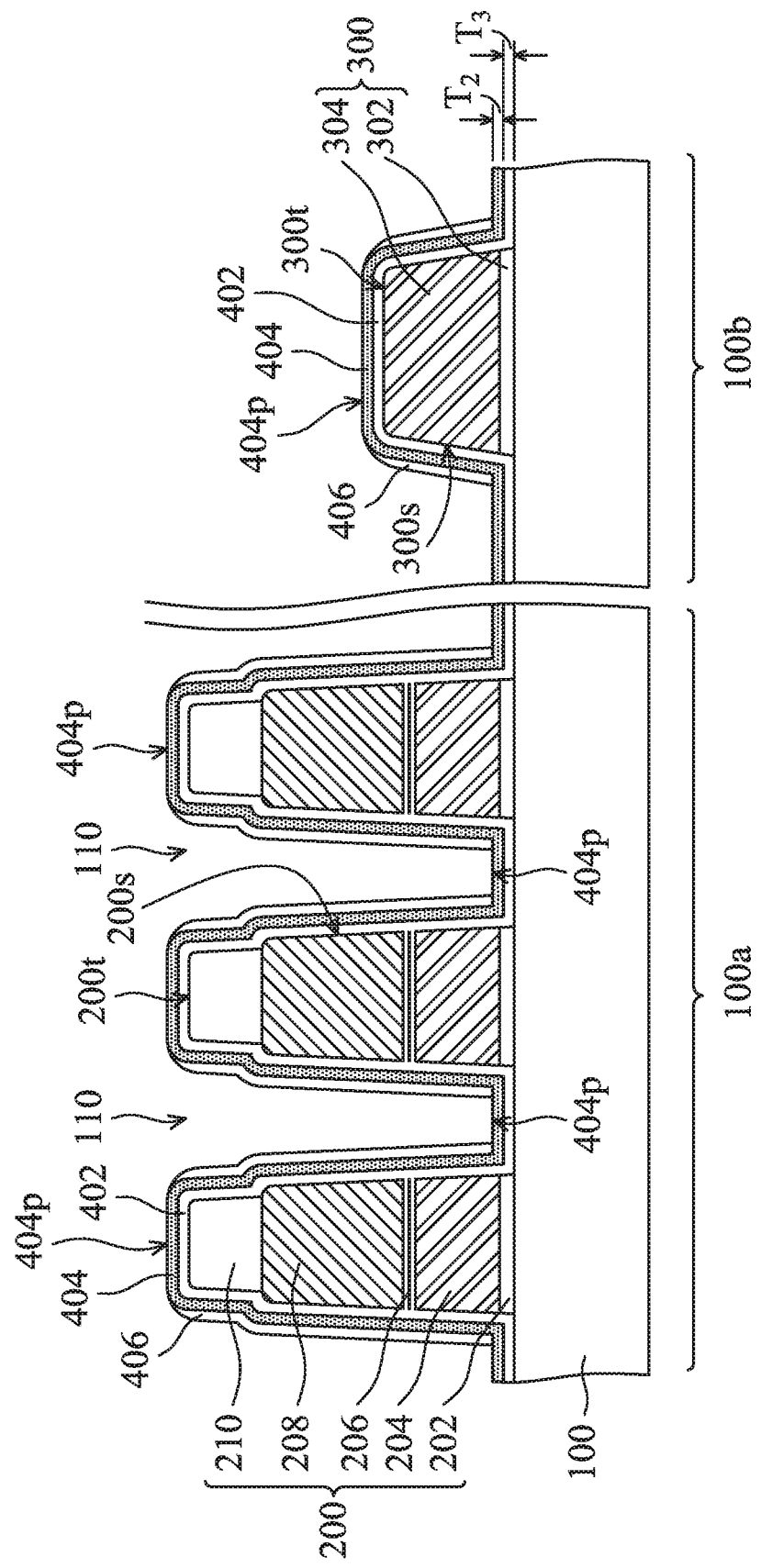

In addition, referring to FIG. 1E, the remaining first sacrificial layer 408 may be removed. Specifically, the first sacrificial layer 408 that covers the sidewalls 200s of the first gate structure 200 and the sidewalls 300s of the second gate structure 300 may be removed. As shown in FIG. 1E, after this step, substantially only the spacer layer 404 and the lining layer 402 that is below the spacer layer 404 remain at the bottoms of the trenches 110.

In accordance with some embodiments, the step of removing the stop layer 406 at the bottoms of the trenches 110 (as shown in FIG. 1D) and the step of removing the remaining first sacrificial layer 408 (as shown in FIG. 1E)

may be performed simultaneously. More specifically, in some embodiments, the step of removing the stop layer 406 at the bottoms of the trenches 110 and the step of removing the remaining first sacrificial layer 408 may be performed using the same wet etching process.

Figure 1F:
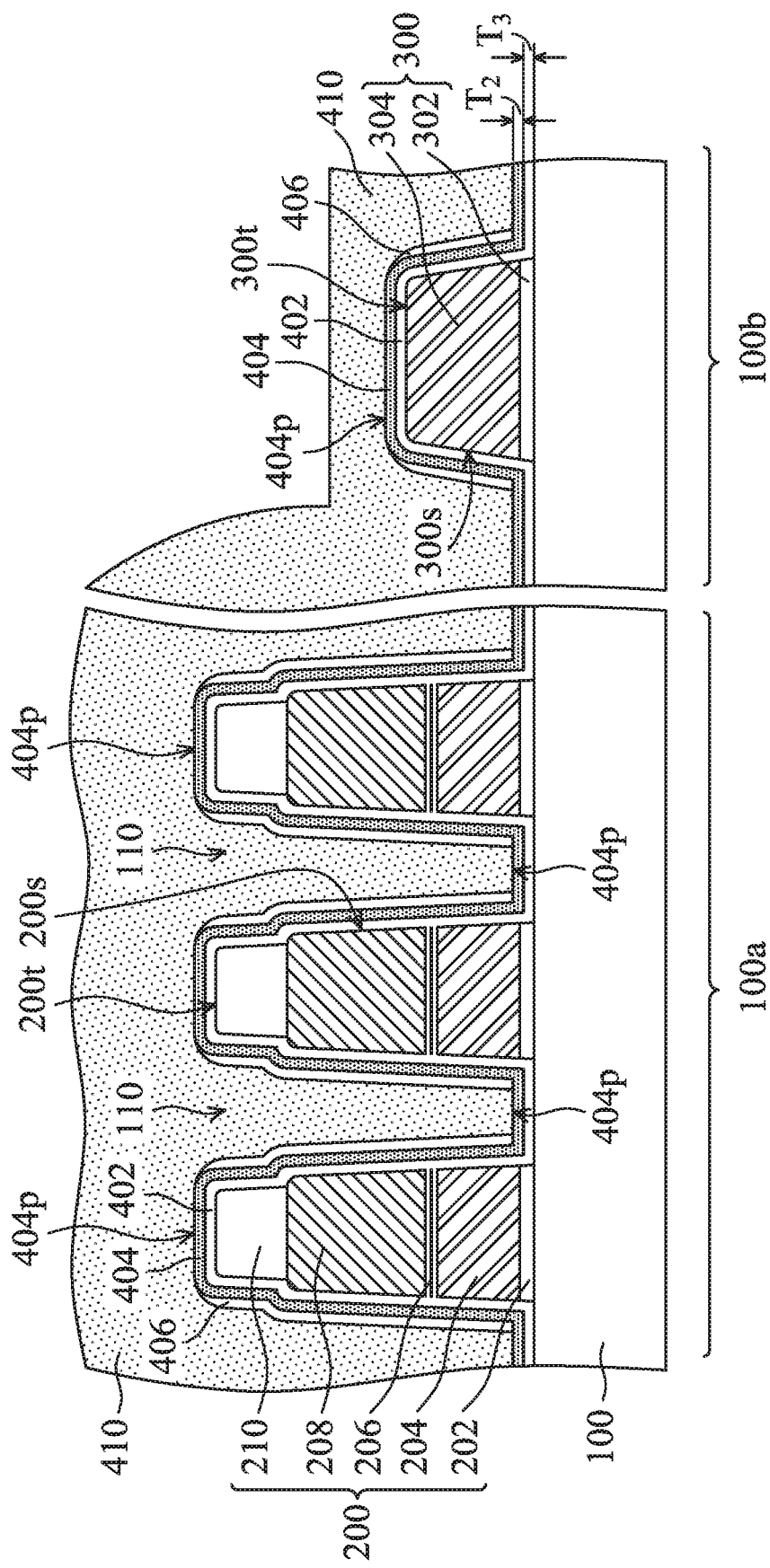

Next, referring to FIG. 1F, a second sacrificial layer 410 may be formed on the substrate 100. The second sacrificial layer 410 may cover the first gate structure 200, the lining layer 402, the spacer layer 404, and the stop layer 406, and may fill in the trenches 110. As shown in FIG. 1F, in some embodiments, the second sacrificial layer 410 may also cover the second gate structure 300 located on the peripheral region 100b.

In some embodiments, the material of the second sacrificial layer 410 may include polycrystalline silicon.

Figure 1G:
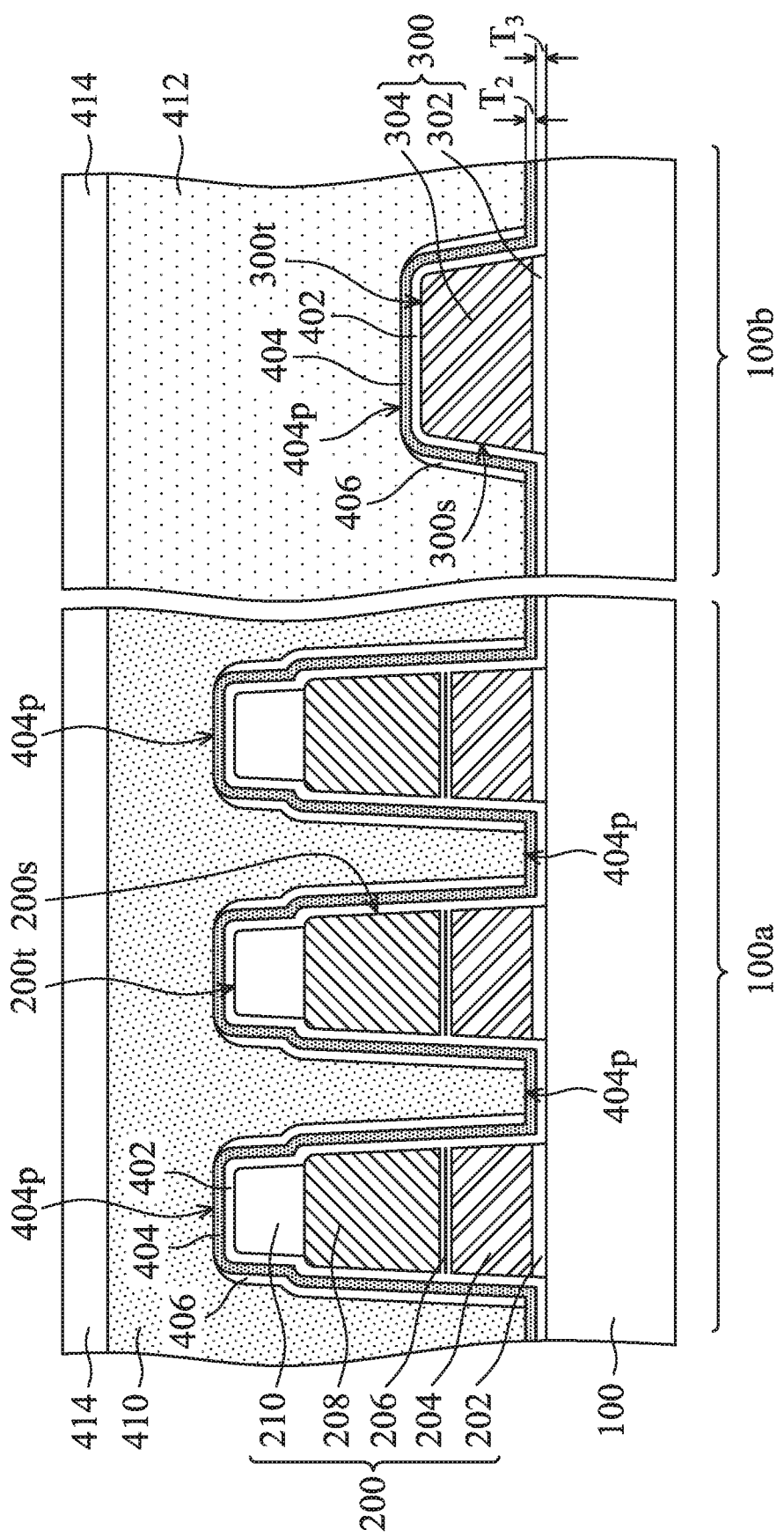

Next, referring to FIG. 1G, in some embodiments, after the step of forming the second sacrificial layer 410 on the substrate 100, an etch-back process may be performed on the second sacrificial layer 410 to remove the second sacrificial layer 410 located on the peripheral region 100b.

In addition, in accordance with some embodiments, a first dielectric layer 412 may be formed on the peripheral region 100b of the substrate 100, and the first dielectric layer 412 may cover the second gate structure 300. In some embodiments, a planarization process may be performed on the first dielectric layer 412 so that the first dielectric layer 412 may have a planar surface, and then a planarization process may be further performed on the second sacrificial layer 410 so that the second sacrificial layer 410 may have a planar surface.

In some embodiments, the material of the first dielectric layer 412 may include spin-on-glass (SOG), borophosphosilicate glass (BPSG), phosphosilicate glass (PSG), silicon oxide, other suitable dielectric materials, or a combination thereof.

Next, a mask layer 414 may be formed on the planarized second sacrificial layer 410 and first dielectric layer 412. In some embodiments, the mask layer 414 may include silicon nitride, silicon oxide, amorphous carbon material, other suitable mask materials, or a combination thereof.

Figure 1H:
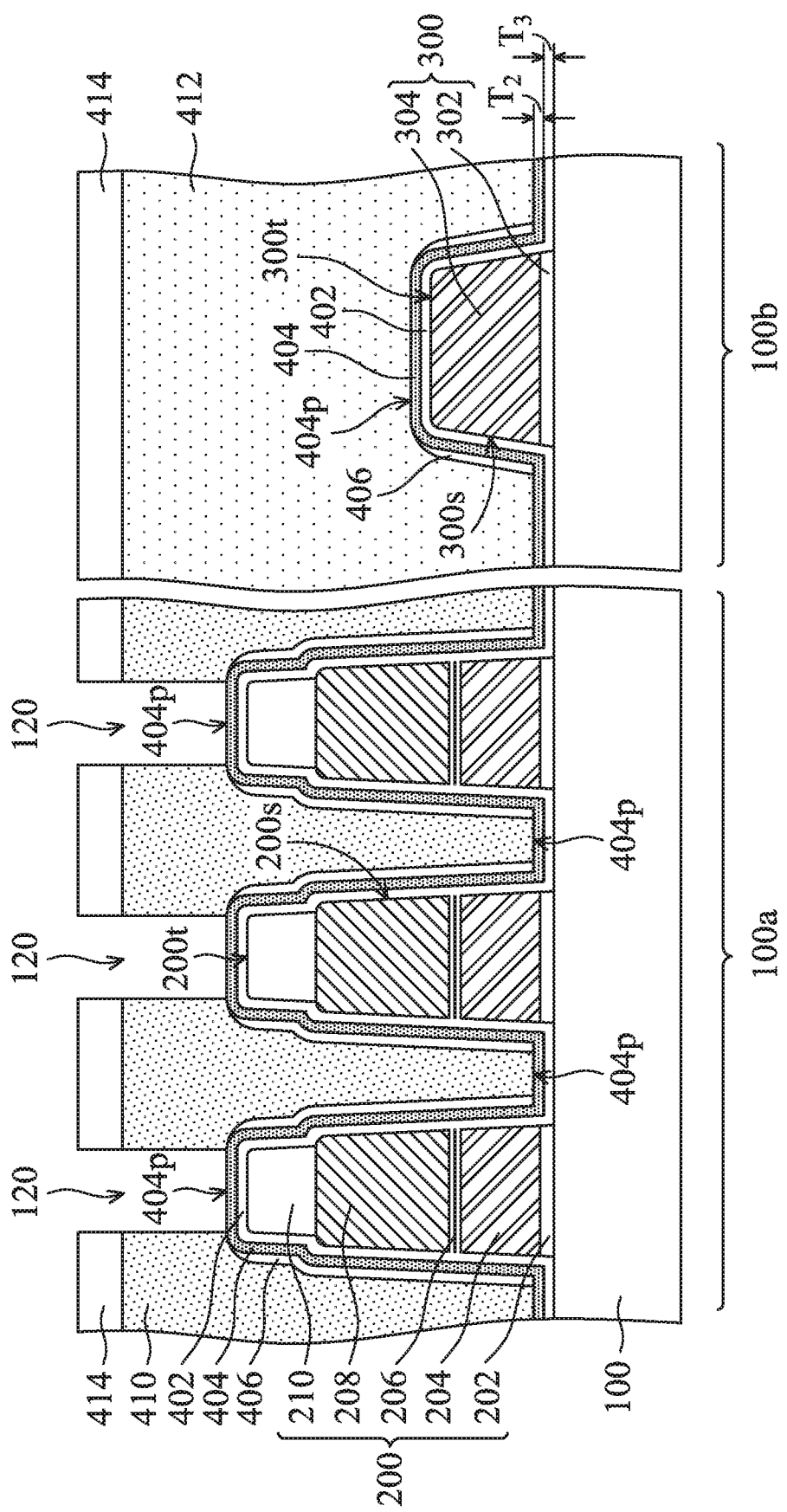

Next, referring to FIG. 1H, in some embodiments, the mask layer 414 may be patterned by a patterning process. The patterned mask layer 414 may define the positions of a plurality of openings 120 that are formed subsequently. Specifically, the patterned mask layer 414 may serve as a mask so that portions of the second sacrificial layer 410 may be removed to form the openings 120 through the second sacrificial layer 410 that are located above the first gate structure 200. In addition, the openings 120 may expose a portion of the top surface 404p of the spacer layer 404.

Furthermore, in some embodiments, the portions of the second sacrificial layer 410 may be removed by a dry etching process to form the openings 120.

Figure 1I:
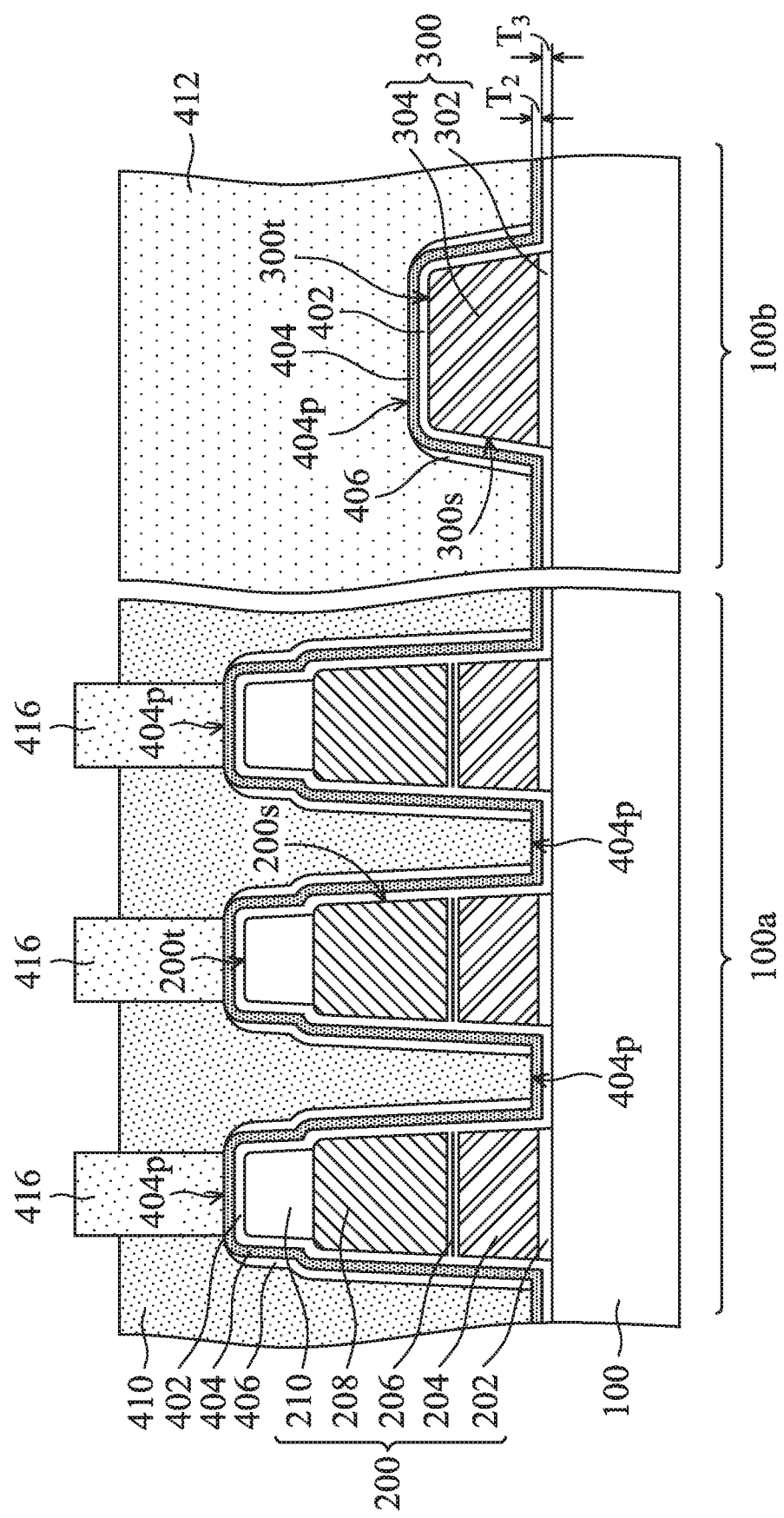

Next, referring to FIG. 1I, in some embodiments, a second dielectric layer 416 may be formed in the openings 120. The second dielectric layer 416 may be used to define the positions of contacts that are formed subsequently in the memory cell region 100a. As shown in FIG. 1I, the second dielectric layer 416 may be disposed substantially directly above the first gate structure 200. In some embodiments, the second dielectric layer 416 may be in contact with the spacer layer 404.

In some embodiments, the material of the second dielectric layer 416 may include silicon oxide, silicon nitride, silicon oxynitride, other suitable dielectric materials, or a combination thereof.

In addition, in some embodiments, after the second dielectric layer 416 is formed in the openings 120, the patterned mask layer 414 may be removed by a wet stripping process, a dry etching process, or a combination thereof.

Figure 1J:
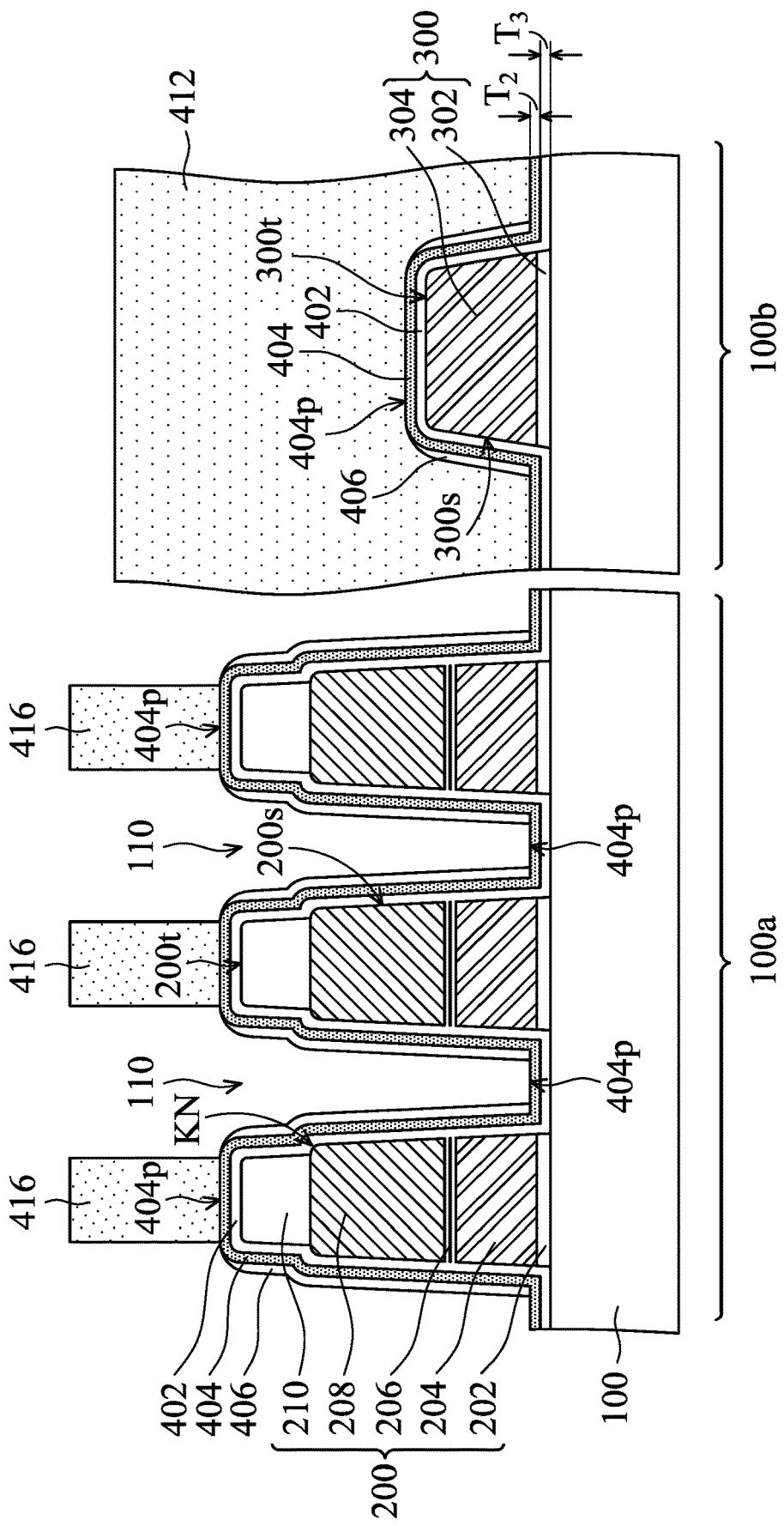
Figure 1K:
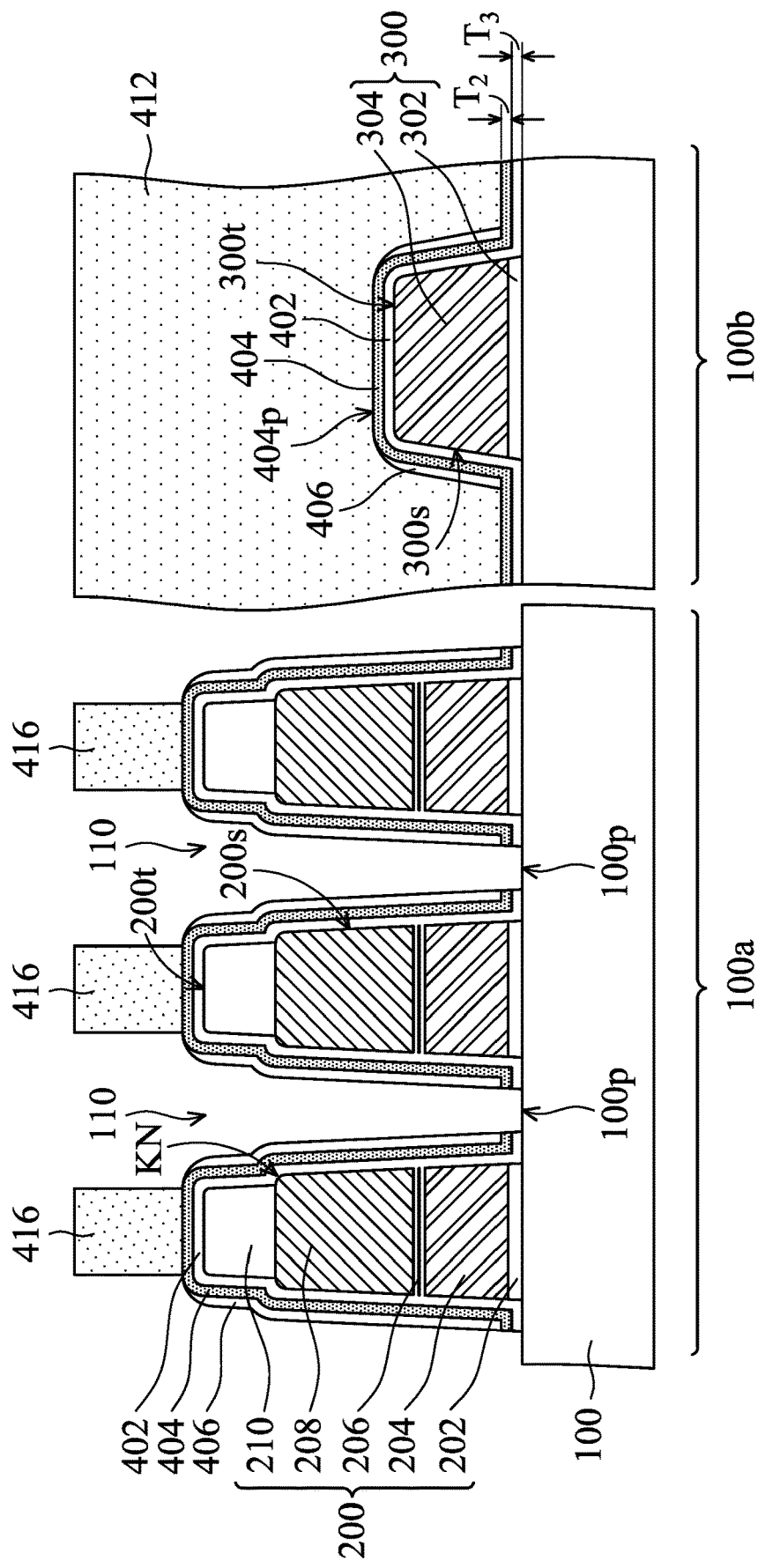

Next, referring to FIG. 1J and FIG. 1K, the second sacrificial layer 410 may be removed, and the spacer layer 404 and the lining layer 402 at the bottoms of the trenches 110 may be removed to expose a portion of the top surface 100p of the substrate 100.

In accordance with some embodiments, the step of removing the remaining second sacrificial layer 410 (as shown in FIG. 1J) and the step of removing the spacer layer 404 and the lining layer 402 at the bottoms of the trenches 110 (as shown in FIG. 1K) may be performed simultaneously. However, in accordance with some other embodiments, the step of removing the remaining second sacrificial layer 410 and the step of removing the spacer layer 404 and the lining layer 402 at the bottoms of the trenches 110 may be performed separately.

In some embodiments, the remaining second sacrificial layer 410, and the spacer layer 404 and the lining layer 402 located at the bottoms of the trenches 110 may be removed by a dry etching process, a wet stripping process, or a combination thereof.

It should be noted that, only the spacer layer 404 and the lining layer 402 remain at the bottoms of the trenches 110, the etching amount that is required in the etching process for removing the spacer layer 404 and the lining layer 402 is reduced in this step. Therefore, a great amount of etching at one time may be avoided and the risk of damaging the first gate structure 200 by the etching process may be reduced.

Specifically, in accordance with some embodiments, since the relatively thick stop layer 406 has been removed in the previous step (as shown in FIG. 1D), only the relatively thin spacer layer 404 and lining layer 402 are subjected to an etching process in this step. In this way, the consumption and thinning of the lining layer 402, the spacer layer 404, and the stop layer 406 located on the sidewalls 200s of the first gate structure 200 by the etching process may be reduced. Therefore, the thicknesses of the lining layer 402, the spacer layer 404, and the stop layer 406 on a shoulder portion KN of the gate structure 200 may be maintained, and short-circuits or leakage current caused by the exposure of the conductive layer 208 (or the shoulder portion KN) of the first gate structure 200 may be avoided.

In some embodiments, the shoulder portion KN of the aforementioned first gate structure 200 may substantially correspond to a top corner of the conductive layer 208.

Figure 1L:
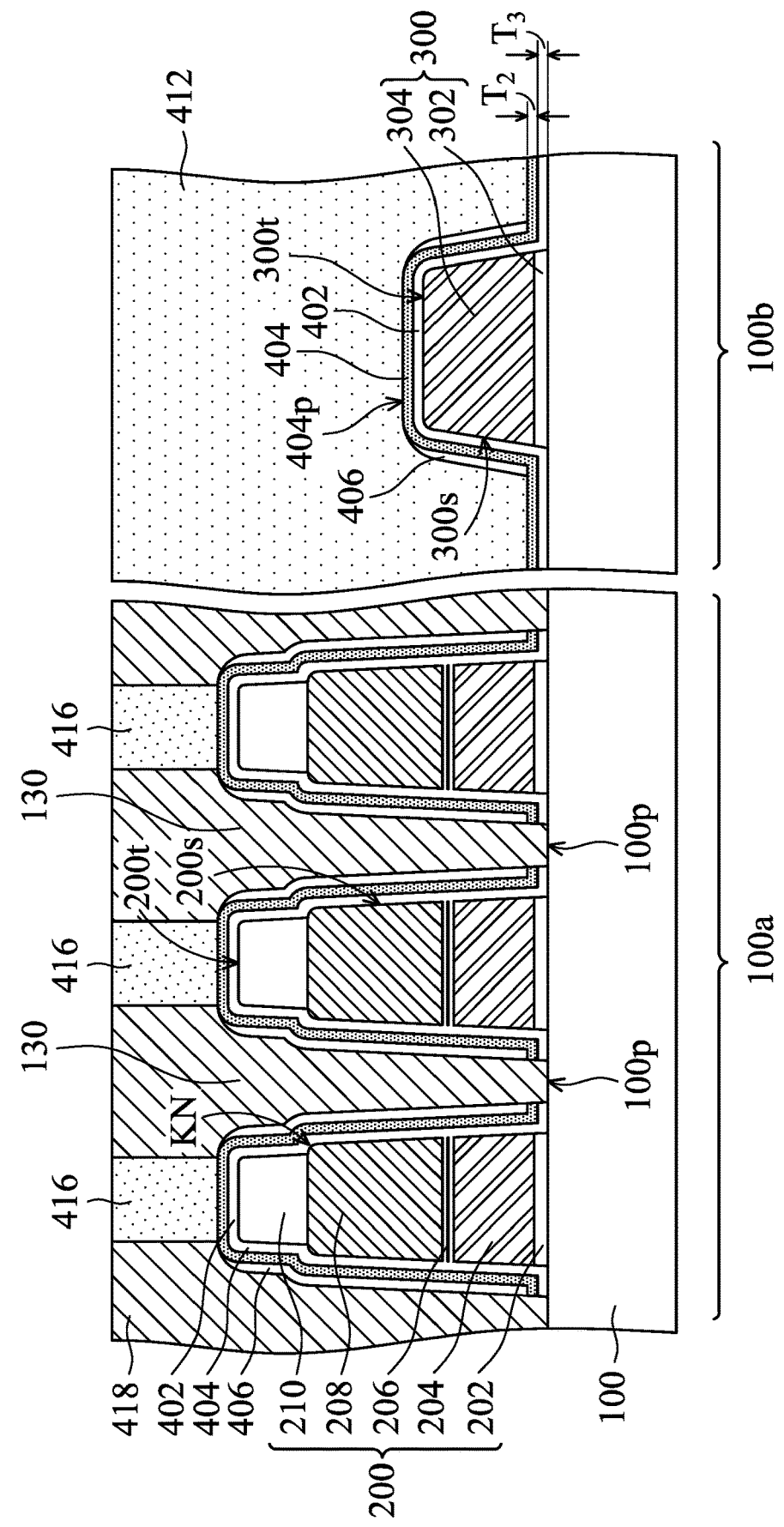
Figure 2:
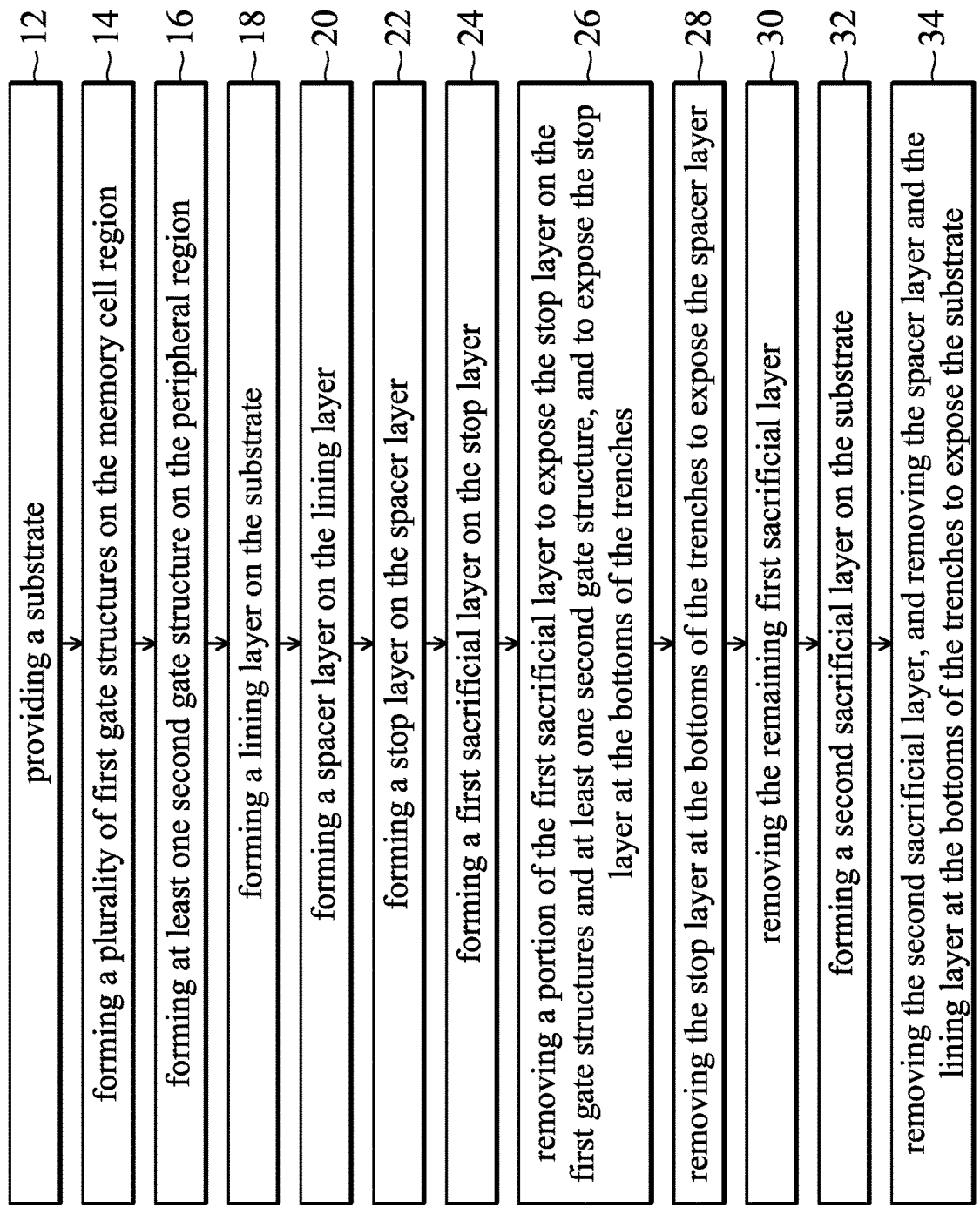
FIG. 2 shows a diagram illustrating the method for manufacturing the memory device of some embodiments of the present disclosure.

Next, referring to FIG. 1L, a conductive material 418 may fill in the trenches 110 that are between the first gate structures 200 to form a plurality of contacts 130. To this step, the stages for manufacturing the memory device 10 are substantially completed. In some embodiments, the contact 130 may be a self-align contact. In some embodiments, the conductive material 418 may be completely filled in the trenches 110 and formed between the second dielectric layers 416.

In some embodiments, the conductive material 418 may include tungsten (W), copper (Cu), aluminum (Al), gold (Au), silver (Ag), titanium (Ti), molybdenum (Mo), nickel (Ni), tungsten alloy, copper alloy, aluminum alloy, gold alloy, silver alloy, titanium alloy, molybdenum alloy, nickel alloy, other suitable conductive materials, or a combination thereof.

To summarize the above, the method for manufacturing the memory device can protect the sidewall structure of the gate structure, reduce the consumption of the sidewall structure of the gate structure that are caused by the etching process performed on the bottom of the trench. Accordingly, the method can prevent the shoulder portion of the gate structure from being exposed, and thereby can improve problems such as word line leakage, bit line leakage or short-circuits.

What is claimed is:

1. A method for manufacturing a memory device, comprising:
   providing a substrate, the substrate comprising a memory cell region and a peripheral region;
   forming a plurality of first gate structures on the memory cell region;
   forming at least one second gate structure on the peripheral region;
   forming a lining layer on the substrate, wherein the lining layer covers the plurality of first gate structures and the at least one second gate structure, and the lining layer is formed at bottoms of a plurality of trenches between the plurality of first gate structures;
   forming a spacer layer on the lining layer;
   forming a stop layer on the spacer layer;
   forming a first sacrificial layer on the stop layer, wherein the first sacrificial layer covers the plurality of first gate structures and the at least one second gate structure, and the first sacrificial layer is formed at the bottoms of the plurality of trenches;
   removing a portion of the first sacrificial layer to expose the stop layer on the plurality of first gate structures and the at least one second gate structure, and to expose the stop layer at the bottoms of the plurality of trenches;
   removing the stop layer at the bottoms of the plurality of trenches to expose the spacer layer;
   removing the remaining first sacrificial layer;
   forming a second sacrificial layer on the substrate, wherein the second sacrificial layer covers the plurality of first gate structures, the lining layer, the spacer layer, and the stop layer, and the second sacrificial layer fills in the plurality of trenches; and
   removing the second sacrificial layer, and removing the spacer layer and the lining layer at the bottoms of the plurality of trenches to expose the substrate.

2. The method for manufacturing a memory device as claimed in claim 1, wherein the step of removing the portion of the first sacrificial layer is performed using a dry etching process.

3. The method for manufacturing a memory device as claimed in claim 1, wherein the step of removing the stop layer at the bottoms of the plurality of trenches and the step of removing the remaining first sacrificial layer are performed using a wet etching process.

4. The method for manufacturing a memory device as claimed in claim 3, wherein the step of removing the stop layer at the bottoms of the plurality of trenches and the step of removing the remaining first sacrificial layer are performed using the same wet etching process.

5. The method for manufacturing a memory device as claimed in claim 1, after the step of removing the stop layer at the bottoms of the plurality of trenches, a top surface of the spacer layer at the bottoms of the plurality of trenches is exposed.

6. The method for manufacturing a memory device as claimed in claim 5, wherein a gap exists between the top surface of the spacer layer and a bottom surface of the first sacrificial layer.

7. The method for manufacturing a memory device as claimed in claim 1, wherein a thickness of the stop layer is greater than a thickness of the spacer layer, and the thickness of the stop layer is greater than the thickness of the lining layer.

8. The method for manufacturing a memory device as claimed in claim 1, wherein the thickness of the stop layer is 0.8 to 1.5 times the sum of the thicknesses of the lining layer and the spacer layer.

9. The method for manufacturing a memory device as claimed in claim 1, after the step of forming the second sacrificial layer on the substrate, further comprising:
   forming a first dielectric layer on the substrate, wherein the first dielectric layer covers the at least one second gate structure.

10. The method for manufacturing a memory device as claimed in claim 1, wherein after the step of forming the second sacrificial layer on the substrate, the method further comprises:
    forming a plurality of openings that penetrate through the second sacrificial layer on the plurality of first gate structures, wherein the plurality of openings expose the spacer layer; and
    filling a second dielectric layer in the plurality of openings.

11. The method for manufacturing a memory device as claimed in claim 1, further comprising:
    filling a conductive material in the plurality of trenches between the plurality of first gate structures to form a plurality of contacts.

12. The method for manufacturing a memory device as claimed in claim 1, wherein the first sacrificial layer is conformally formed on the stop layer.

13. The method for manufacturing a memory device as claimed in claim 1, wherein the step of removing the stop layer at bottoms of the plurality of trenches selectively removes the stop layer without removing the spacer layer.

14. The method for manufacturing a memory device as claimed in claim 1, wherein the step of removing the stop layer at bottoms of the plurality of trenches also removes the stop layer located above the plurality of first gate structures and the at least one second gate structure.

15. The method for manufacturing a memory device as claimed in claim 14, after the stop layer located above the plurality of first gate structures and the at least one second gate structure are removed, a portion of the top surface of the stop layer located above the plurality of first gate structures and the at least one second gate structure are exposed.

16. The method for manufacturing a memory device as claimed in claim 15, wherein a gap exists between the portion of the top surface of the stop layer located above the plurality of first gate structures and the first sacrificial layer.

17. The method for manufacturing a memory device as claimed in claim 1, wherein the material of the first sacrificial layer comprises polycrystalline silicon.

18. The method for manufacturing a memory device as claimed in claim 1, wherein the material of the stop layer comprises silicon oxide.

19. The method for manufacturing a memory device as claimed in claim 1, wherein the material of the spacer layer comprises silicon nitride, silicon oxynitride, or a combination thereof.

20. The method for manufacturing a memory device as claimed in claim 1, wherein the material of the lining layer comprises silicon oxide.

* * * * *